US008391080B2

(12) United States Patent
Sarin et al.

(10) Patent No.: US 8,391,080 B2
(45) Date of Patent: Mar. 5, 2013

(54) ERASE VOLTAGE REDUCTION IN A NON-VOLATILE MEMORY DEVICE

(75) Inventors: Vishal Sarin, Cupertino, CA (US); Dzung H. Nguyen, Fremont, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 13/276,359

(22) Filed: Oct. 19, 2011

(65) Prior Publication Data

US 2012/0033504 A1    Feb. 9, 2012

Related U.S. Application Data

(63) Continuation of application No. 12/271,223, filed on Nov. 14, 2008, now Pat. No. 8,064,267.

(51) Int. Cl.
*G11C 16/04* (2006.01)

(52) U.S. Cl. ......... 365/185.29; 365/185.18; 365/185.22; 365/185.17

(58) Field of Classification Search ............. 365/185.29, 365/185.18, 185.22, 185.17
See application file for complete search history.

(56) References Cited

U.S. PATENT DOCUMENTS

| 5,412,608 | A | 5/1995 | Oyama |
| 5,615,147 | A | 3/1997 | Chang et al. |
| 5,959,891 | A | 9/1999 | Sansbury |
| 6,222,775 | B1 | 4/2001 | Cappelletti |
| 6,269,025 | B1 | 7/2001 | Hollmer et al. |
| 6,426,894 | B1* | 7/2002 | Hirano ...................... 365/185.18 |
| 6,798,699 | B2 | 9/2004 | Mihnea et al. |
| 6,914,820 | B1 | 7/2005 | Wong |
| 2003/0128591 | A1 | 7/2003 | Mihnea et al. |
| 2007/0206432 | A1* | 9/2007 | Ishikawa et al. .............. 365/226 |

OTHER PUBLICATIONS

N. Ajika et al. "A 5 Volt Only 16M Bit Flash EEPROM Cell With a Simple Stacked Gate Structure", LSI Research and Development Laboratory Mitsubishi Electric Corporation, IEEE, 1990 pp. 4.
Roberto Bez, et al. "Introduction to Flash Memory," Proceedings of the IEEE, Apr. 2003, vol. 91, No. 4, pp. 489-502.

* cited by examiner

*Primary Examiner* — Tuan T. Nguyen
(74) *Attorney, Agent, or Firm* — Leffert Jay & Polglaze, P.A.

(57) ABSTRACT

In erasing a memory block of memory cells, a semiconductor tub that contains a memory block to be erased can be biased with a high, positive voltage. The control gates of the memory cells that make up the memory block can be biased with a negative voltage. An erase verification can then be performed to determine if the memory block has been successfully erased. If the memory block has not been erased, the erase operation of biasing the tub with the positive voltage and the control gates with the negative voltage can be repeated until the erase verification is successful.

20 Claims, 5 Drawing Sheets

ERASE VOLTAGE REDUCTION IN A NON-VOLATILE MEMORY DEVICE

RELATED APPLICATIONS

This is a continuation of U.S. patent application Ser. No. 12/271,223, titled "ERASE VOLTAGE REDUCTION IN A NON-VOLATILE MEMORY DEVICE", filed Nov. 14, 2008 now U.S. Pat. No. 8,064,267, (allowed) which is related to co-pending patent application titled "SYSTEMS AND METHODS FOR ERASING A MEMORY", U.S. patent application Ser. No. 12/271,185, filed Nov. 14, 2008 (allowed) both of which are commonly assigned and incorporated herein by reference.

TECHNICAL FIELD

The present invention relates generally to memory devices and in a particular embodiment the present invention relates to non-volatile memory devices.

BACKGROUND

Memory devices can include internal, semiconductor, integrated circuits in computers or other electronic devices. There are many different types of memory including random-access memory (RAM), read only memory (ROM), dynamic random access memory (DRAM), static RAM (SRAM), synchronous dynamic RAM (SDRAM), and flash memory.

Flash memory devices have developed into a popular source of non-volatile memory for a wide range of electronic applications. Flash memory devices typically use a one-transistor memory cell that allows for high memory densities, high reliability, and low power consumption. Common uses for flash memory include personal computers, personal digital assistants (PDAs), digital cameras, and cellular telephones. Program code and system data such as a basic input/output system (BIOS) are typically stored in flash memory devices for use in personal computer systems.

A typical erase operation holds the word lines of the memory block being erased at ground potential while the tub of the memory block is formed is biased at a high positive voltage. The high positive voltage can typically be in a range of 22-24V. The memory block is typically 64 pages of single level cell data and 128 pages of multilevel cell data where each page is page is typically comprised of 2048 bytes of data with 32 word lines.

The capacitance of the tub of the memory block being erased can typically be relatively high. The high capacitance makes it difficult for the charge pump to increase the voltage of the tub to the required high erase voltage. Therefore, a larger charge pump is used to produce the necessary high tub voltage, which often leads to larger die size. This goes against the trend by memory device manufacturers of reducing memory die size.

Additionally, the power consumption of the larger charge pump is high because of its size. Larger charge pumps are not as efficient as smaller charge pumps and, therefore, waste power more so than smaller pumps. The higher power consumption of the inefficient large charge pumps also goes against the current trend by memory manufacturers of reducing power requirements for memory devices.

For the reasons stated above, and for other reasons stated below that will become apparent to those skilled in the art upon reading and understanding the present specification, there is a need in the art to reduce the typical high erase voltage in a non-volatile memory device.

DETAILED DESCRIPTION

Figure 1:
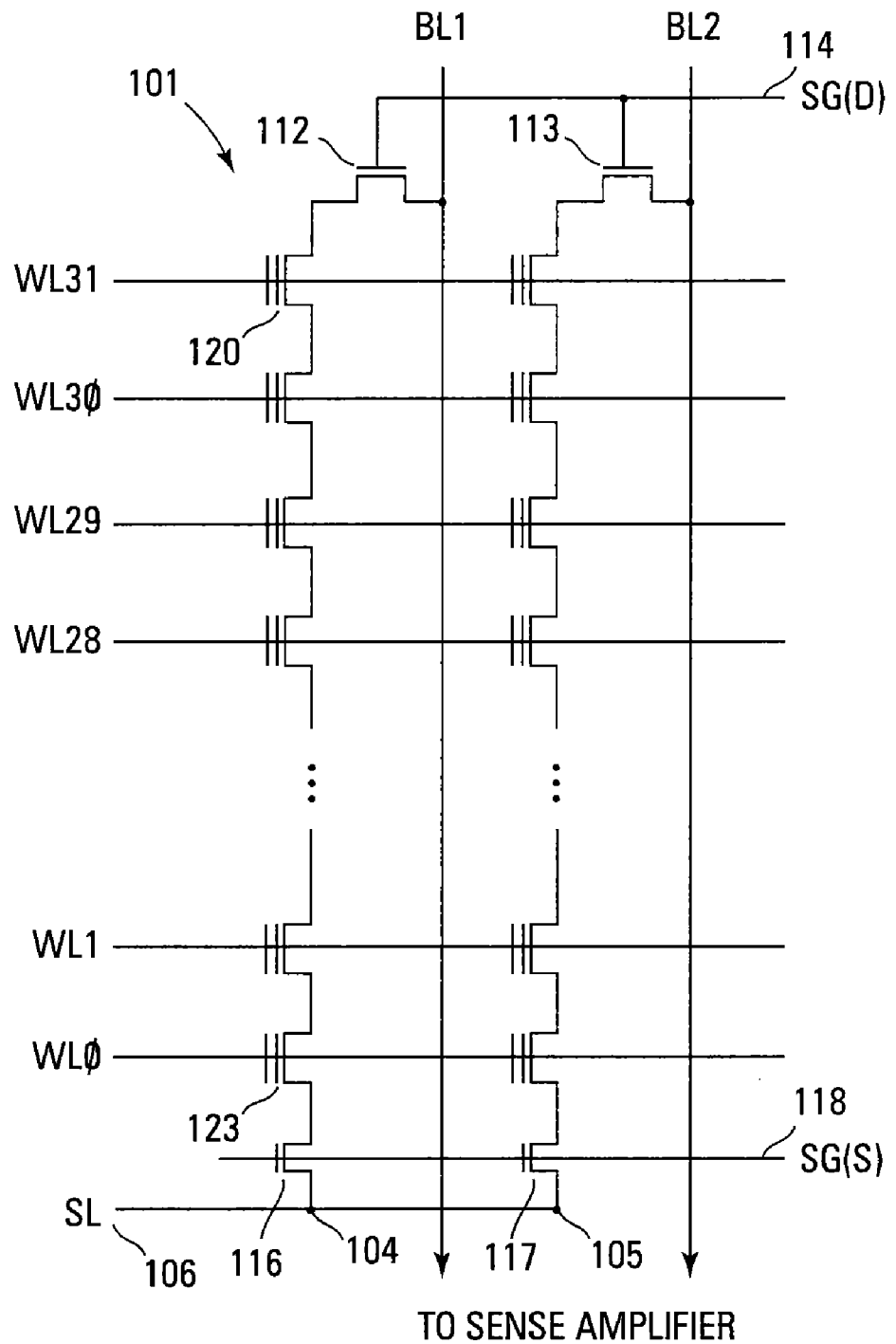
FIG. 1 shows schematic diagram of one embodiment of series NAND strings of memory cells.

In the following detailed description of the invention, reference is made to the accompanying drawings that form a part hereof and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. The following detailed description is, therefore, not to be taken in a limiting sense, and the scope of the present invention is defined only by the appended claims and equivalents thereof.

FIG. 1 illustrates a schematic diagram of a portion of a NAND architecture memory array 101 comprising series strings of non-volatile memory cells on which one embodiment of the method for erasing can be used. While FIG. 1 and the subsequent discussions refer to a NAND memory device, the present embodiments are not limited to such an architecture but can be used in other memory device architectures as well.

The memory array is comprised of an array of non-volatile memory cells 101 (e.g., floating gate) arranged in columns such as series strings 104, 105. Each of the cells 101 are coupled drain to source in each series string 104, 105. An access line (e.g. word line) WL0-WL31 that spans across multiple series strings 104, 105 is connected to the control gates of each memory cell in a row in order to bias the control gates of the memory cells in the row. The data lines (e.g., bit lines) BL1, BL2 are eventually connected to sense amplifiers (not shown) that detect the state of each cell by sensing current on a particular bit line.

Each series string 104, 105 of memory cells is coupled to a source line 106 by a source select gate 116, 117 and to an individual bit line BL1, BL2 by a drain select gate 112, 113. The source select gates 116, 117 are controlled by a source select gate control line SG(S) 118 coupled to their control gates. The drain select gates 112, 113 are controlled by a drain select gate control line SG(D) 114.

Each memory cell can be programmed as a single level cell (SLC) or multilevel cell (MLC). Each cell's threshold voltage ($V_t$) is indicative of the data that is stored in the cell. For example, in an SLC, a $V_t$ of 0.5V might indicate a programmed cell while a $V_t$ of −0.5V might indicate an erased cell. The MLC may have multiple $V_t$ windows that each indicate a different state. Multilevel cells can take advantage of the analog nature of a traditional flash cell by assigning a bit pattern to a specific voltage range stored on the cell. This technology permits the storage of two or more bits per cell, depending on the quantity of voltage ranges assigned to the cell.

At least one embodiment of the erase method of the present disclosure biases, with a negative erase voltage, the control gates of memory cells coupled to word lines WL0-WL31 of the memory block being erased. In one embodiment, the word line erase voltage can be in the range of −4V to −6V. Substantially simultaneously with the negative word line voltage, the p-well in which the memory block being erased is formed is biased at a positive voltage in the range of 16V to 18V. The combination of the negative word line voltage and the lower, positive p-well voltage provides a substantially similar voltage differential during the erase operation as in a prior art erase operation without the need for a high voltage on the p-well.

Figure 2:
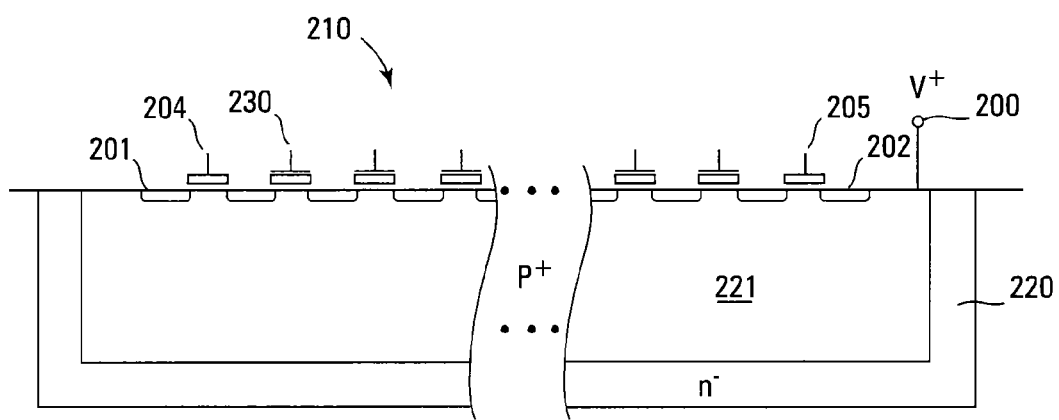
FIG. 2 shows a cross sectional view of one embodiment of a substrate p-well that contains at least one block of non-volatile memory cells.

FIG. 2 illustrates a cross sectional view of one embodiment of a semiconductor tub in a substrate. The illustrated tub, also referred to in the art as a well, is comprised of a p-type material 221 (e.g., silicon) that is substantially surrounded by an n-type material 220. The n-type material 220 isolates the well from the remainder of the substrate elements. Alternate embodiments can use opposite doping of the tub and surrounding isolating material.

The block of memory cells to be erased is formed in the p-well. In one embodiment, more than one block of memory cells can be formed in the p-well. FIG. 2 also shows a cross sectional view of one series NAND string of memory cells. The memory block is comprised of a plurality of series strings of memory cells 210, as illustrated in FIG. 1, formed between a source line 201 and a drain line 202. Access to the source line 201 is controlled by the select gate source transistor 204. Access to the drain line 202 and thus the bit line is controlled by the select gate drain transistor 205. As illustrated in FIG. 1, the series connected memory cells 230 are located between the select gate source transistor 204 and the select gate drain transistor 205.

The p-well bias $V^+$ 200 is applied to the p-well material during the erase operation. A typical prior art tub bias is in the 22V to 24V range. The erase method of the present embodiments can use a substantially reduced voltage in a range of 16V to 18V. The smaller p-well bias is easier to provide with a smaller charge pump than is required by the prior art.

The conductivity types (i.e., p+, n−) illustrated in FIG. 2 are for purposes of illustration only. In an alternate embodiment, the well can be an n-type material that is isolated from the rest of the substrate by p-type implants.

Figure 3:
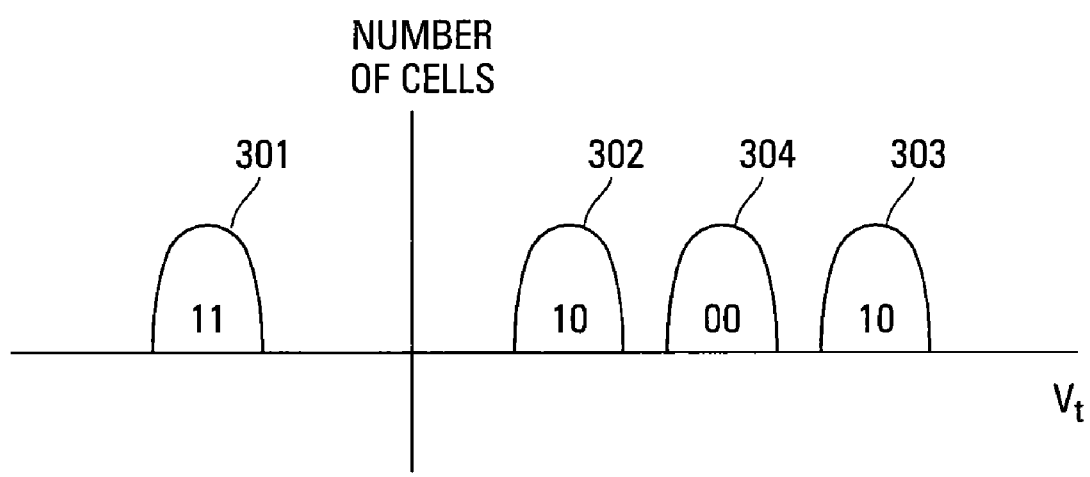
FIG. 3 shows one embodiment of a $V_t$ distribution in accordance with the erase method of FIG. 4.

FIG. 3 illustrates one embodiment of a memory cell threshold voltage ($V_t$) distribution for a multiple bit memory device. This figure shows that the logical 11 state 301 is the most negative state and is typically referred to as the erased state. The logical 10 state 302 is the most positive state. The logical 01 state 303 and the logical 00 state 304 are located between the most negative and most positive states 301, 302. The logical states assigned to each distribution are for purposes of illustration only. Alternate embodiments can have other logical states assigned to each distribution as well as different numbers of distributions, depending on the programmable density of the memory cells.

As a result of the erase operation of the present disclosure, a memory cell's threshold voltage is moved from one of the programmed states 302-304 to the erased state 301. For example, if a flash memory cell is programmed to the logical 10 state 303, the erase operation of the present disclosure would move the memory cell's threshold voltage from the logical 10 state 303 to the logical 11 state 301.

A single bit memory device would have only two threshold voltage distributions. One distribution is the negative threshold distribution and represents the logical "1" state for erased memory cells. The second distribution is the positive, programmed state that is represented by a logical "0".

Figure 4:
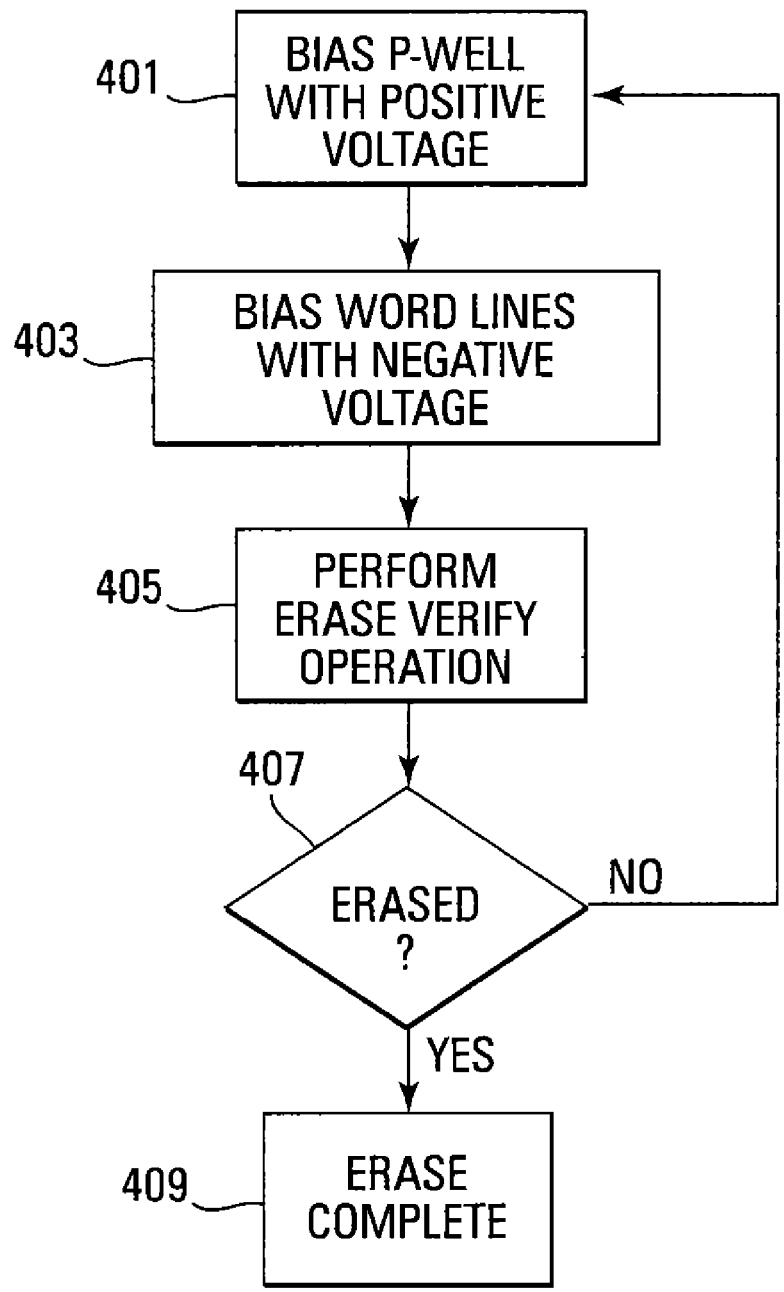
FIG. 4 shows a flowchart of one embodiment of a method for erasing a block of memory cells in a non-volatile memory device.

FIG. 4 illustrates a flowchart of one embodiment of a method for erasing a memory block of non-volatile memory cells. The p-well in which the memory block is formed is biased at the positive voltage as previously discussed 401 and the word lines of the memory block are biased at the negative voltage as previously discussed 403. During this time, the bit lines are biased at an enable voltage such as 0V.

An erase verify operation is then performed 405 to determine if the erase step was successful. The erase verify operation is substantially similar to a read operation to determine if the memory cell contents are all logical ones or all logical zeros for reverse logic.

In one embodiment, the erase verification is comprised of biasing selected memory cells with an erase verify voltage $V_{wl}$ to the memory cell control gate (e.g., via a select line, such as a word line). If the $V_t$ is less than or equal to $V_{wl}$, the cell conducts. If $V_t$ is greater than $V_{wl}$, the cell does not conduct. $V_{wl}$ can be 1.0V during erase verification and the unselected word lines are biased at 4.5V. Alternate embodiments may use other voltage levels for both the selected and unselected word lines. The selected bit lines are biased at another voltage (e.g., $V_{CC}$).

If the erase verification operation 405 determines that the memory block is erased 407, the erase operation is complete 409. If the erase verification operation 405 determines that the memory block is not erased 407, the erase steps that include the positive voltage bias of the p-well 401 and the negative voltage bias of the memory block word lines 403 are repeated. The erase steps are repeated until the erase verification is successful or an error condition is flagged.

Figure 5:
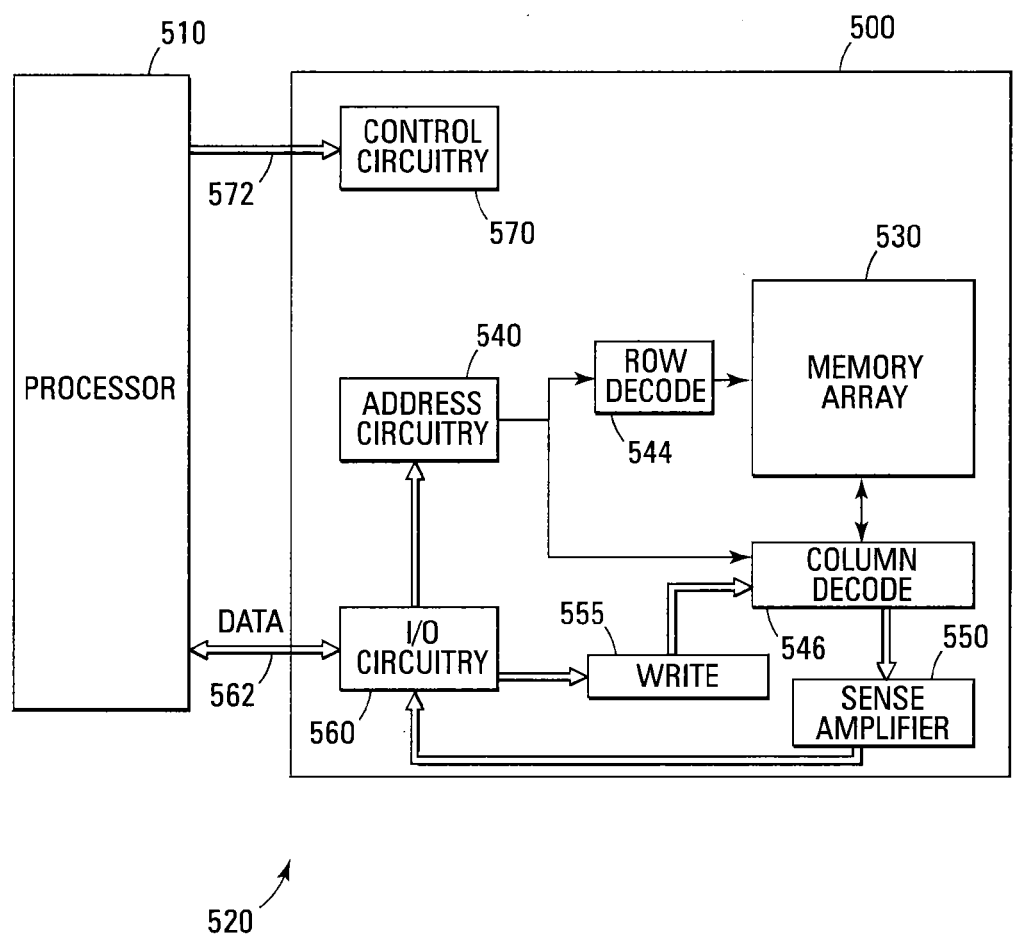
FIG. 5 shows block diagram of one embodiment of a memory system that incorporates the erase method of FIG. 4.

FIG. 5 illustrates a functional block diagram of a memory device 500. The memory device 500 is coupled to an external processor 510. The processor 510 may be a microprocessor or some other type of controlling circuitry. The memory device 500 and the processor 510 form part of a memory system 520. The memory device 500 has been simplified to focus on features of the memory that are helpful in understanding the present invention.

The memory device 500 includes an array 530 of non-volatile memory cells, such as the one illustrated previously in FIG. 3. The memory array 530 is arranged in banks of word line rows and bit line columns. In one embodiment, the columns of the memory array 530 are comprised of series strings of memory cells. As is well known in the art, the connections of the cells to the bit lines determines whether the array is a NAND architecture, an AND architecture, or a NOR architecture.

Address buffer circuitry 540 is provided to latch address signals provided through the I/O circuitry 560. Address signals are received and decoded by a row decoder 544 and a column decoder 546 to access the memory array 530. It will be appreciated by those skilled in the art, with the benefit of the present description, that the number of address input connections depends on the density and architecture of the memory array 530. That is, the number of addresses increases with both increased memory cell counts and increased bank and block counts.

The memory device 500 reads data in the memory array 530 by sensing voltage or current changes in the memory array columns using sense amplifier circuitry 550. The sense amplifier circuitry 550, in one embodiment, is coupled to read and latch a row of data from the memory array 530. Data input and output buffer circuitry 560 is included for bidirectional data communication as well as address communication over a plurality of data connections 562 with the controller 510. Write circuitry 555 is provided to write data to the memory array.

Memory control circuitry 570 decodes signals provided on control connections 572 from the processor 510. These signals are used to control the operations on the memory array 530, including data read, data write (program), and erase operations. The memory control circuitry 570 may be a state machine, a sequencer, or some other type of controller to generate the memory control signals. In one embodiment, the memory control circuitry 570 is configured to execute the erase method of the present disclosure in order to reduce the high p-well voltage normally required for an erase operation.

The flash memory device illustrated in FIG. 5 has been simplified to facilitate a basic understanding of the features of the memory. A more detailed understanding of internal circuitry and functions of flash memories are known to those skilled in the art.

CONCLUSION

In summary, one or more embodiments reduce the high tub voltage normally required during an erase operation for a non-volatile memory block. In one such embodiment, the semiconductor tub is biased with a positive voltage that is much greater than $V_{CC}$ such as in the range of 16V to 18V. The control gates of the memory cells in the memory block being erased are biased with a negative voltage in the range of −4V to −6V. Since the potential difference during the erase operation of the present disclosure is kept the same as in the prior art erase operation, the endurance characteristics (e.g., program/erase cycle) and erase distribution window are not impacted.

Although specific embodiments have been illustrated and described herein, it will be appreciated by those of ordinary skill in the art that any arrangement that is calculated to achieve the same purpose may be substituted for the specific embodiments shown. Many adaptations of the invention will be apparent to those of ordinary skill in the art. Accordingly, this application is intended to cover any adaptations or variations of the invention. It is manifestly intended that this invention be limited only by the following claims and equivalents thereof.

What is claimed is:

1. A memory device comprising:
a memory array comprising memory cells; and
a charge pump configured to bias a semiconductor tub of a block of the memory cells to be erased with a positive voltage during an erase operation, wherein control gates of memory cells of the block to be erased are biased with a negative voltage during the erase operation.

2. The memory device of claim 1, wherein the control gates of the memory cells of the block to be erased are coupled to a plurality of word lines that are biased with the negative voltage.

3. The memory device of claim 1, wherein the memory cells are formed in a plurality of series strings of memory cells such that each series string of memory cells is coupled to a bit line.

4. The memory device of claim 3, wherein each bit line of the memory cells of the block to be erased is biased at an enable voltage.

5. The memory device of claim 4, wherein the enable voltage is 0V.

6. The memory device of claim 1, wherein the positive voltage is greater than 16V.

7. The memory device of claim 1, wherein the memory cells are multilevel cells.

8. A memory device comprising:
a memory array comprising memory cells; and
a charge pump configured to bias a p-well of a block of the memory cells to be erased with a positive voltage during an erase operation, wherein control gates of memory cells of the block to be erased are biased with a negative voltage during the erase operation.

9. The memory device of claim 8, wherein the p-well is formed in a silicon substrate.

10. The memory device of claim 8, and further comprising an n-type material surrounding the p-well.

11. The memory device of claim 8, wherein the memory cells to be erased are single level cells.

12. The memory device of claim 8, wherein the positive voltage is less than 18V.

13. A system comprising:
a processor; and
a memory device coupled to the processor, wherein the memory device comprises:
a memory array comprising memory cells; and
a charge pump configured to bias a semiconductor tub of a block of the memory cells to be erased with a positive voltage during an erase operation, wherein control gates of memory cells of the block to be erased are biased with a negative voltage during the erase operation.

14. The system of claim 13, wherein the processor is configured to generate control signals to the memory device that control operation of the charge pump.

15. The system of claim 13, wherein the negative voltage is less than −4V.

16. The system of claim 13, wherein the positive voltage is greater than $V_{CC}$.

17. A system comprising:
a processor; and
a memory device coupled to the processor, wherein the memory device comprises:
a memory array comprising memory cells; and
a charge pump configured to bias a p-well of a block of the memory cells to be erased with a positive voltage during an erase operation, wherein control gates of memory cells of the block to be erased are biased with a negative voltage during the erase operation.

18. The system of claim 17, and further comprising memory control circuitry in the memory device that decodes control signals from the processor.

19. The system of claim 18, wherein the memory control circuitry is configured to control the charge pump.

20. The system of claim 17, wherein the memory array comprises one of a NAND architecture, a NOR architecture, or an AND architecture.

* * * * *